(12) United States Patent
Hshieh et al.

(10) Patent No.: US 7,094,640 B2
(45) Date of Patent: Aug. 22, 2006

(54) METHOD OF MAKING A TRENCH MOSFET DEVICE WITH IMPROVED ON-RESISTANCE

(75) Inventors: Fwu-Iuan Hshieh, Saratoga, CA (US); Koon Chong So, Fremont, CA (US); John E. Amato, Tracy, CA (US); Yan Man Tsui, Union City, CA (US)

(73) Assignee: General Semiconductor, Inc., Melville, NY (US)

( * ) Notice: Subject to any disclaimer, the term of this patent is extended or adjusted under 35 U.S.C. 154(b) by 0 days.

(21) Appl. No.: 10/725,325

(22) Filed: Dec. 1, 2003

(65) Prior Publication Data
US 2004/0113203 A1 Jun. 17, 2004

Related U.S. Application Data

(62) Division of application No. 09/999,116, filed on Nov. 21, 2001, now Pat. No. 6,657,254.

(51) Int. Cl.
*H01L 21/8238* (2006.01)
*H01L 21/336* (2006.01)

(52) U.S. Cl. .................. 438/212; 438/259; 438/270; 438/271

(58) Field of Classification Search ............ 257/341, 257/342, 329, 330, 331; 438/212, 259, 270, 438/271, 589, 588, 587
See application file for complete search history.

(56) References Cited

U.S. PATENT DOCUMENTS

| 4,893,160 A | 1/1990 | Blanchard ............ 357/23.4 |
| 5,072,266 A | 12/1991 | Bulucea et al. ........... 257/330 |
| 5,442,214 A | 8/1995 | Yang .................... 257/328 |
| 5,541,425 A | 7/1996 | Nishihara .............. 257/139 |
| 5,866,931 A | 2/1999 | Bulucea et al. ........... 257/331 |
| 5,929,481 A | 7/1999 | Hshieh et al. ............ 257/328 |
| 6,084,268 A | 7/2000 | de Fresart et al. ........ 257/342 |

FOREIGN PATENT DOCUMENTS

| JP | 6-21468 | 1/1994 | ................ 257/330 |

*Primary Examiner*—Steven Loke
(74) *Attorney, Agent, or Firm*—Mayer & Williams PC; Stuart H. Mayer, Esq.; Karin L. Williams, Esq.

(57) ABSTRACT

A method of forming a trench MOSFET device includes depositing an epitaxial layer over a substrate, both having the first conductivity type, the epitaxial layer having a lower majority carrier concentration than the substrate, forming a body region of a second conductivity type within an upper portion of the epitaxial layer, etching a trench extending into the epitaxial layer from an upper surface of the epitaxial layer, the trench extending to a greater depth from the upper surface of the epitaxial layer than the body region, forming a doped region of the first conductivity type between a bottom portion of the trench and substrate, the doped region having a majority carrier concentration that is lower than that of the substrate and higher than that of the epitaxial layer, wherein the doped region is diffused and spans 100% of the distance from the trench bottom portion to the substrate, forming an insulating layer lining at least a portion of the trench, forming a conductive region within the trench adjacent the insulating layer and forming a source region of said first conductivity type within an upper portion of the body region and adjacent the trench.

6 Claims, 4 Drawing Sheets

METHOD OF MAKING A TRENCH MOSFET DEVICE WITH IMPROVED ON-RESISTANCE

STATEMENT OF RELATED APPLICATION

This application is a division of U.S. patent application Ser. No. 09/999,116 entitled "Trench MOSFET Device With Improved On-Resistance," filed on Nov. 21, 2001 now U.S. Pat. No. 6,657,254.

BACKGROUND OF THE INVENTION

The present invention relates to trench MOSFET devices, and more particularly to trench MOSFET devices with improved on-resistance.

A trench MOSFET (metal-oxide-semiconductor field-effect transistor) is a transistor in which the channel is formed vertically and the gate is formed in a trench extending between the source and drain. The trench, which is lined with a thin insulator layer such as an oxide layer and filled with a conductor such as polysilicon (i.e., polycrystalline silicon), allows less constricted current flow and thereby provides lower values of specific on-resistance. Examples of trench MOSFET transistors are disclosed, for example, in U.S. Pat. Nos. 5,072,266, 5,541,425, and 5,866,931, the disclosures of which are hereby incorporated by reference.

As a specific example, FIG. 1 illustrates half of a hexagonally shaped trench MOSFET structure 21 disclosed in U.S. Pat. No. 5,072,266. The structure includes an n+ substrate 23, upon which is grown a lightly doped n epitaxial layer 25 of a predetermined depth $d_{epi}$. Within the epitaxial layer 25, p body region 27 (p, p+) is provided. In the design shown, the p body region 27 is substantially planar (except in a central region) and typically lays a distance $d_{min}$ below the top surface of the epitaxial layer. Another layer 28 (n+) overlying most of the p body region 27 serves as source for the device. A series of hexagonally shaped trenches 29 are provided in the epitaxial layer, opening toward the top and having a predetermined depth $d_{tr}$. The trenches 29 are typically lined with oxide and filled with conductive polysilicon, forming the gate for the MOSFET device. The trenches 29 define cell regions 31 that are also hexagonally shaped in horizontal cross-section. Within the cell region 31, the p body region 27 rises to the top surface of the epitaxial layer and forms an exposed pattern 33 in a horizontal cross section at the top surface of the cell region 31. In the specific design illustrated, the p+ central portion of the p body region 27 extends to a depth $d_{max}$ below the surface of the epitaxial layer that is greater than the trench depth $d_{tr}$ for the transistor cell so that breakdown voltage is away from the trench surface and into the bulk of the semiconductor material.

A typical MOSFET device includes numerous individual MOSFET cells that are fabricated in parallel within a single chip (i.e., a section of a semiconductor wafer). Hence, the chip shown in FIG. 1 contains numerous hexagonal-shaped cells 31 (portions of five of these cells are illustrated). Cell configurations other than hexagonal configurations are commonly used, including square-shaped configurations. In a design like that shown in FIG. 1, the substrate region 23 acts as a common drain contact for all of the individual MOSFET cells 31. Although not illustrated, all the sources for the MOSFET cells 31 are typically shorted together via a metal source contact that is disposed on top of the n+ source regions 28. An insulating region, such as borophosphosilicate glass (not shown) is typically placed between the polysilicon in the trenches 29 and the metal source contact to prevent the gate regions from being shorted with the source regions. Consequently, to make gate contact, the polysilicon within the trenches 29 is typically extended into a termination region beyond the MOSFET cells 31, where a metal gate contact is provided on the polysilicon. Since the polysilicon gate regions are interconnected with one another via the trenches, this arrangement provides a single gate contact for all the gate regions of the device. As a result of this scheme, even though the chip contains a matrix of individual transistor cells 31, these cells 31 behave as a single large transistor.

Demand persists for trench MOSFET devices having ever-lower on-resistance. One way to decrease on-resistance is to decrease the thickness of the epitaxial layer. As a result, the region of the epitaxial layer lying between the body region and the substrate (see numeral 25 in FIG. 1) is reduced in thickness. Since this region is of relatively high resistivity, the on-resistance of the device is reduced. However, as is known in the art, the risk of breakdown increases as the epitaxial layer becomes thinner, particularly in the termination region, which is more vulnerable to breakdown.

SUMMARY OF THE INVENTION

According to an embodiment of the invention, a trench MOSFET device is provided. The device comprises: (a) a substrate of a first conductivity type (preferably an n-type conductivity silicon substrate); (b) an epitaxial layer of the first conductivity type over the substrate, wherein the epitaxial layer has a lower majority carrier concentration than the substrate; (c) a trench extending into the epitaxial region from an upper surface of the epitaxial layer; (d) an insulating layer (preferably an oxide layer) lining at least a portion of the trench; (e) a conductive region (preferably a doped polysilicon region) within the trench adjacent the insulating layer; (f) a doped region of the first conductivity type formed within the epitaxial layer between a bottom portion of the trench and the substrate, wherein the doped region has a majority carrier concentration that is lower than that of the substrate and higher than that of the epitaxial layer; (g) a body region of a second conductivity type (preferably p-type conductivity) formed within an upper portion of the epitaxial layer and adjacent the trench, wherein the body region extends to a lesser depth from the upper surface of the epitaxial layer than does the trench; and (h) a source region of the first conductivity type formed within an upper portion of the body region and adjacent the trench.

The presence of the doped region lying between the bottom portion of the trench and the substrate (sometimes referred to herein as a "trench bottom implant" based on its preferred mode of formation) serves to reduce the on-resistance of the device. Preferably this region extends more than 50% of the distance from the trench bottom to the substrate, more preferably 100% of the distance from the trench bottom to the substrate.

According to another embodiment of the invention, a method of forming a trench MOSFET device is provided. The method comprises: (a) providing a substrate of a first conductivity type; (b) depositing an epitaxial layer of the first conductivity type over the substrate, the epitaxial layer having a lower majority carrier concentration than the substrate; (c) forming a body region of a second conductivity type within an upper portion of the epitaxial layer; (d) etching a trench extending into the epitaxial region from an upper surface of the epitaxial layer such that the trench extends to a greater depth from the upper surface of the epitaxial layer than does the body region; (e) forming a doped region of the first conductivity type between a bottom portion of the trench and the substrate such that the doped region has a majority carrier concentration that is lower than that of the substrate and higher than that of the epitaxial layer; (f) forming an insulating layer lining at least a portion of the trench; (g) forming a conductive region within the trench adjacent the insulating layer; (h) forming a source region of the first conductivity type within an upper portion of the body region and adjacent the trench.

The doped region is preferably formed by a method comprising implanting a dopant of the first conductivity type into the epitaxial region, and diffusing dopant of the first conductivity type at elevated temperature. More preferably, the doped region is formed in connection with the trench by a method comprising: (a) forming a trench mask on the epitaxial layer; (b) etching the trench through the trench mask; (c) implanting a dopant of the first conductivity type through the trench mask; and (c) diffusing the dopant at elevated temperature. Even more preferably, the diffusion step is conducted concurrently with the growth of a sacrificial oxide along walls of the trench.

Trench bottom implants have been previously used to address a problem arising from devices that have deep body regions which extend to greater depths than the trenches (such as the deep body regions of FIG. 1). More specifically, U.S. Pat. No. 5,929,481 is directed to a trench MOSFET device having deep body regions that extend deeper than the trench. Unfortunately, these deep body regions, which are provided to avoid trench corner electrical breakdown, create the problem of a parasitic JFET at the trench bottom. To reduce this parasitic JFET, a doped trench bottom implant region is provided at the bottom of the trench, which extends into the surrounding drift region. The trench bottom implant region has the same doping type, but is more highly doped, than the surrounding drift region. In contrast to U.S. Pat. No. 5,929,481, however, the trench MOSFET devices of the present invention are not provided with such deep body regions. Instead, the trenches of the devices of the present invention extend to a greater depth than do the body regions.

One advantage of the present invention is that a trench MOSFET cell is provided which has improved on-resistance.

Another advantage of the present invention is that a trench MOSFET cell with improved on-resistance is provided, without a substantial increase in design and process complexity.

Another advantage of the present invention is that a trench MOSFET cell can be provided, which has reduced resistance in the epitaxial layer between the trench bottoms and the substrate. In this way, on-resistance is reduced without thinning the epitaxial layer and compromising breakdown characteristics within the termination region.

The above and other embodiments and advantages of the present invention will become immediately apparent to those of ordinary skill in the art upon review of the Detailed Description and Claims to follow.

DETAILED DESCRIPTION OF PREFERRED EMBODIMENTS OF THE INVENTION

The present invention now will be described more fully hereinafter with reference to the accompanying drawings, in which preferred embodiments of the present invention are shown. This invention may, however, be embodied in different forms and should not be construed as limited to the embodiments set forth herein.

The present invention is directed to novel trench MOSFET structures in which a region of relatively high majority carrier concentration (sometimes referred to herein as a "trench bottom implant" based on its preferred mode of formation) is provided between the trench bottom and the substrate. One advantage associated with such a trench MOSFET structure is improved on-resistance.

Figure 1:
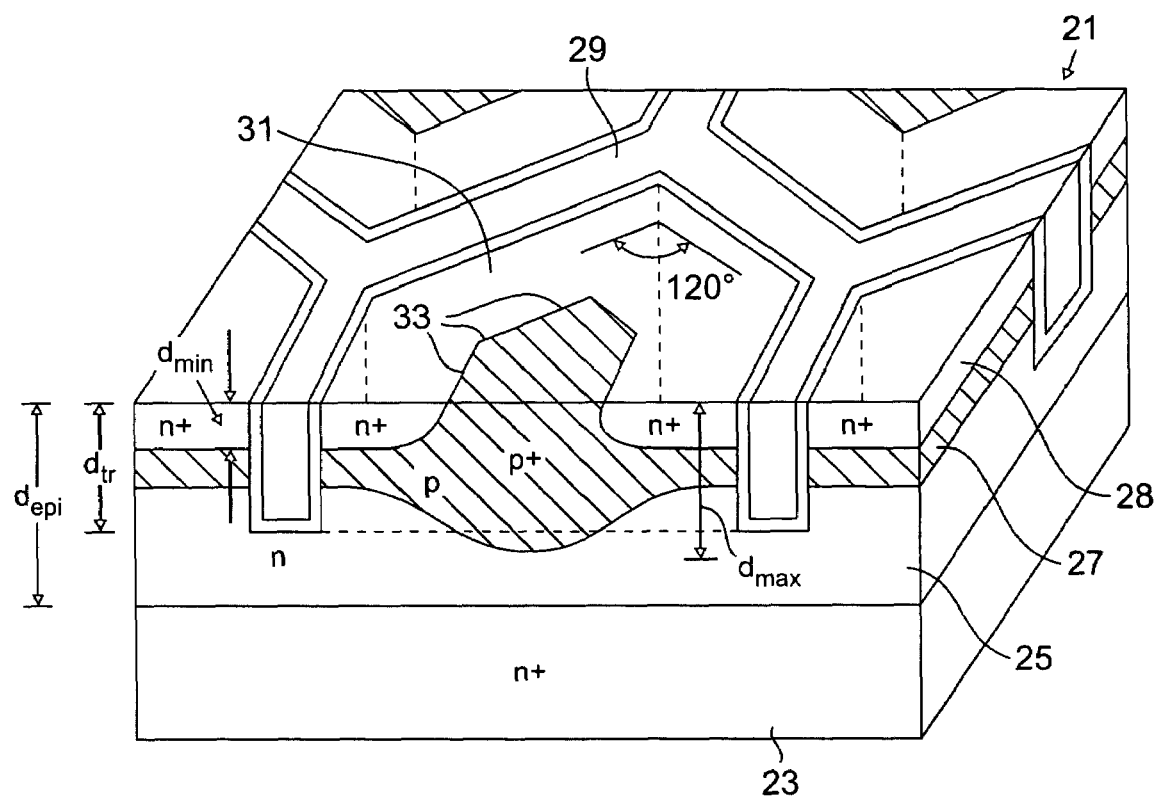
FIG. 1 is a schematic cross-sectional view of a trench MOSFET device in the prior art.
Figure 2:
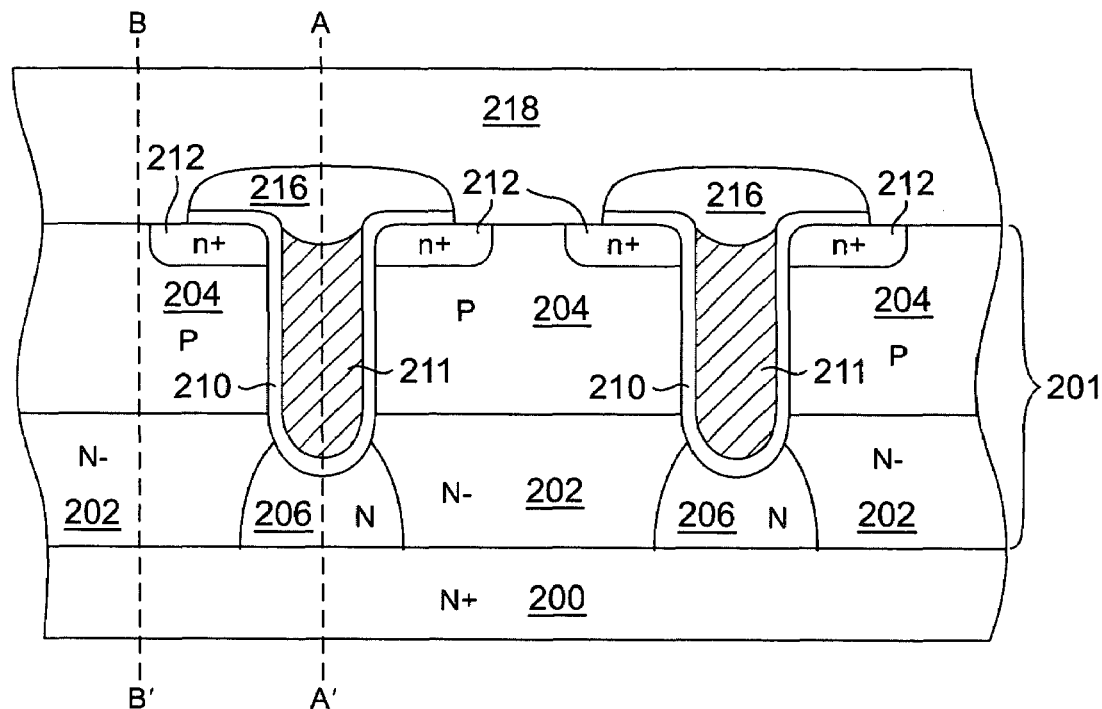
FIG. 2 is a schematic cross-sectional view of a trench MOSFET device, according to an embodiment of the present invention.

FIG. 2 illustrates a trench MOSFET in accordance with an embodiment of the present invention. In the trench MOSFET shown, an epitaxial layer 201 is provided on an N+ substrate 200.

The N+ substrate 200 in this specific example is a silicon substrate having a thickness ranging, for example, from 10 to 25 mils and a net doping concentration ranging, for example, from $1 \times 10^{19}$ to $1 \times 10^{20}$ cm$^{-3}$.

N– regions 202 are found in the lower portion of the epitaxial layer 201. In this example, these regions have a thickness ranging from, for example, 2 to 5 microns and a net doping concentration ranging, for example, from $4 \times 10^{15}$ to $8 \times 10^{16}$ cm$^{-3}$.

P-body regions 204 are found in the upper portion of the epitaxial layer 201. In the example shown, these P-body regions 204 range, for example, from 1 to 2 microns in thickness and have a net doping concentration ranging, for example, from $1 \times 10^{17}$ to $1 \times 10^{18}$ cm$^{-3}$.

Trenches formed within the epitaxial layer are lined with an insulator 210, such as oxide, and are filled with a conductor 211, such as doped polysilicon, providing the gate electrode function of the device. The trenches typically have a depth of 1.5 to 2.5 microns. Where silicon oxide (typically as silicon dioxide) is used as the insulator 210, it can be for example, 500 to 700 Angstroms thick. Where polysilicon is used as the conductor 211, it can have a resistivity of, for example, 1 to 15 ohm/sq. The regions between the trenches are frequently referred to as "mesas" or "trench mesas", based on their shapes. These regions are commonly square or hexagonal in plan view.

In accordance with the present invention, N regions 206 (also referred to herein as "trench bottom implants") are provided between the trench bottoms and the N+ substrate. N regions 206 have a net doping concentration ranging, for example, from $1 \times 10^{18}$ to $5 \times 10^{19}$ cm$^{-3}$. These regions 206 preferably extend the entire distance from the trench bottoms to the N+ substrate 200 as shown, but can also partially bridge the distance if desired. Typically, these regions range from 1 to 6 microns in depth.

The trench MOSFET device of FIG. 2 also contains N+ source regions 212, which extend, in the embodiment illustrated, to a depth of 0.3 to 0.5 micron from the epitaxial layer surface and have net doping concentrations ranging, for example, from $5\times10^{19}$ to $5\times10^{20}$ cm$^{-3}$.

Electrical contact is made with the N+ source regions 212 via metal source contact 218. Insulating regions such as BPSG (borophosphosilicate glass) regions 216 prevent the polysilicon regions 211 associated with the gate electrodes from being shorted to the N+ source regions 212 through the source contact 218. A separate metal gate contact (not shown) is typically connected to the gate runner portion of the polysilicon 211 located outside of the region of the trench MOSFET cells. A metal drain contact (not shown) is also typically provided adjacent the N+ substrate 200.

Figure 3:
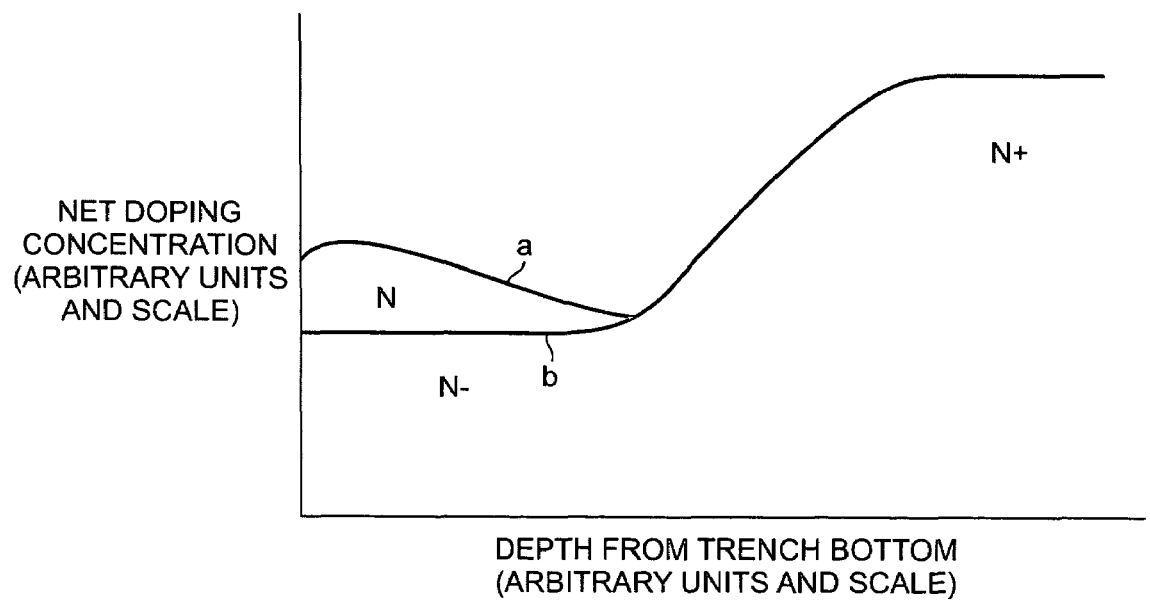
FIG. 3 shows approximate plots of concentration v. distance (in arbitrary units and scale) over portions of the cross-sections defined by lines A–A' (curve a) and B–B' (curve b) of FIG. 2.

Illustrated in curve a of FIG. 3 is the approximate doping profile found along the portion of line A–A' of FIG. 2 that begins at the trench bottom and extends into the substrate 200. The left-hand portion of curve a corresponds to N region 206, while the right-hand portion corresponds to the N+ substrate 200. For comparison, the approximate doping profile found along a parallel portion of line B–B' within FIG. 2 is illustrated in curve b of FIG. 3. The left-hand portion of curve b corresponds to the N– epitaxial region 202, while the right-hand portion corresponds to the N+ substrate 200.

Although not wishing to be bound by theory, it is believed that, upon creation of a potential difference between the p-body regions 204 and the polysilicon regions 211 of the gate, charges are capacitively induced within the p-body body regions 204 adjacent to the gate oxide layer 210, resulting in the formation of channels within the p-body regions 204. When another potential difference is provided between the sources 212 and the N+ substrate 200 (corresponding to the drain), a current flows from the sources 212 to the N+ substrate 200 through the channels formed in the P-body regions 204 adjacent the gate oxide layer 210, and the trench MOSFET is said to be in the power-on state. It is further believed that the device of FIG. 2 has improved on-resistance, because the N regions 206 formed at the bases of the trenches provide paths of reduced resistance for the current flowing from the sources 212 to the drain (N+ substrate 200) while the transistor is in the power-on state.

A method for manufacturing a trench MOSFET like that shown in FIG. 2 will now be described in connection with FIGS. 4A to FIG. 4C, in accordance with one embodiment of the present invention.

Figure 4A:
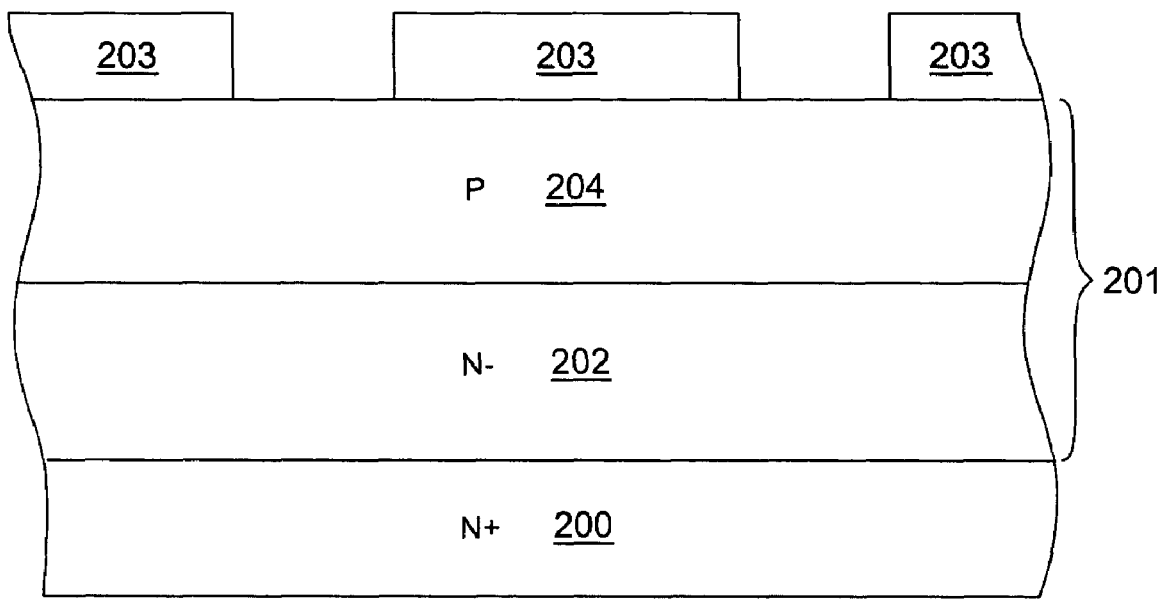
FIGS. 4A through 4C are schematic cross-sectional views illustrating a method of making a trench MOSFET device like of FIG. 2, according to an embodiment of the present invention.
Figure 4B:
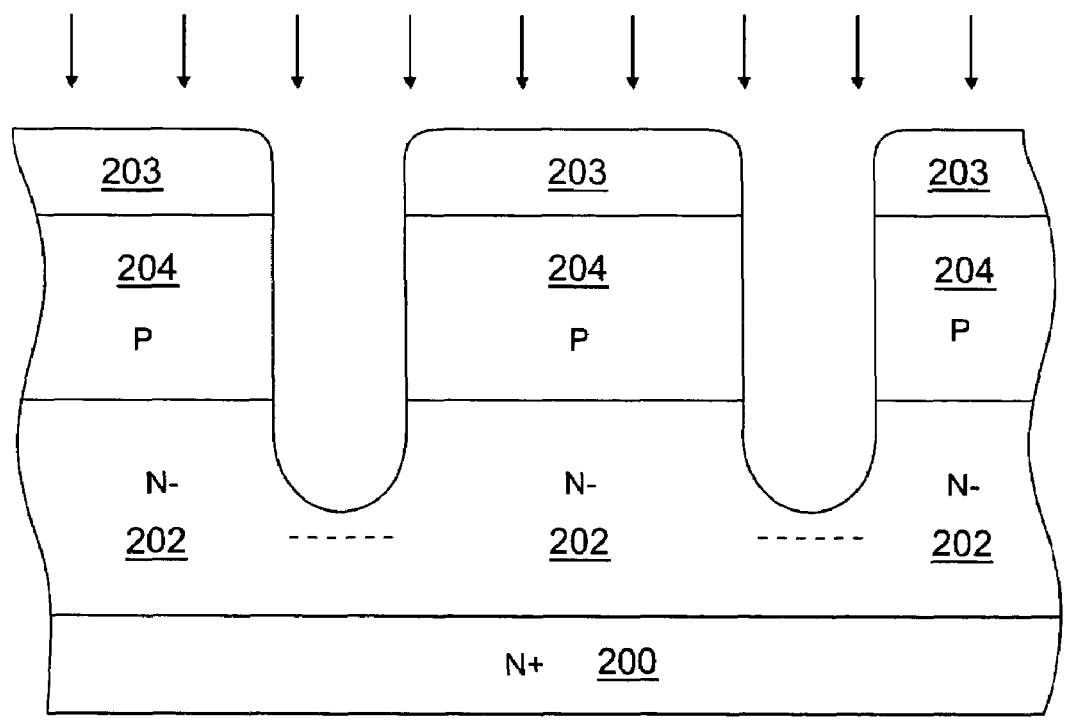
Figure 4C:
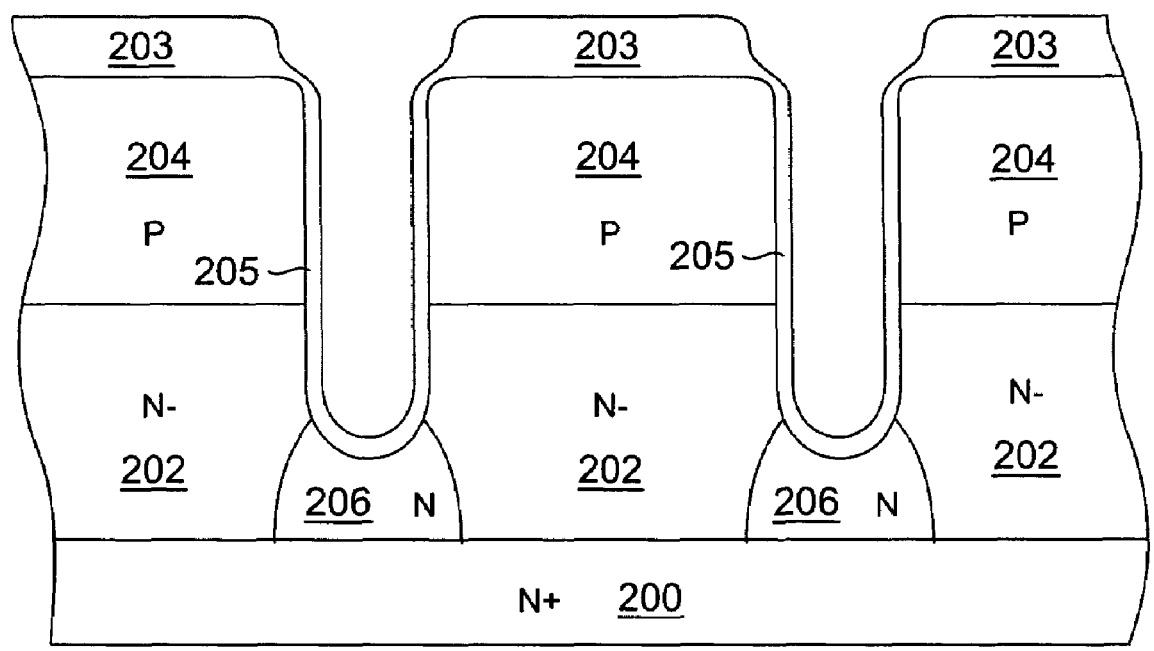

Turning now to FIG. 4A, an N doped epitaxial layer 201 is initially grown on an N+ doped substrate 200. The N+ doped substrate 200, for example, can be from 10 to 25 mils and have a net doping concentration ranging, for example, from $1\times10^{19}$ to $1\times10^{20}$ cm$^{-3}$. The epitaxial layer 201, for example, can have a net n-type doping concentration of $4\times10^{15}$ to $8\times10^{16}$ cm$^{-3}$ and can range from 3 to 10 microns in thickness.

Using masking as appropriate, a P-type region 204 is then formed in the epitaxial layer 201 by implantation and diffusion. For example, the epitaxial layer 201 may be implanted with boron followed by diffusion at elevated temperature to produce a P-type region 204, which can be 1 to 2 microns thick and have a net p-type doping concentration ranging, for example, from $1\times10^{17}$ to $1\times10^{18}$ cm$^{-3}$. After this step, an N-portion 202 of the epitaxial layer 201 remains, which can be 2 to 5 microns thick. N-portion 202 has the n-type doping concentration noted above for epitaxial layer 201.

A mask oxide layer 203 is then deposited, for example, by chemical vapor deposition, and etched by reactive ion etch after being provided with a patterned trench mask (not shown). The resulting structure is shown in FIG. 4A.

Trenches are then etched through apertures in the patterned mask oxide layer 203, typically by reactive ion etching. Trench depths in this example are about 1.5 to 2.5 microns. Discrete P-body regions 204 are established as a result of this trench-forming step.

At this point, an n-type dopant, preferably phosphorous, is implanted into the structure using the trench mask as an implantation mask. In this example, phosphorous is implanted at 80 to 100 keV with a dosage of $5\times10^{15}$ to $1\times10^{17}$ cm$^{-3}$. The resulting structure is shown in FIG. 4B. The dashed lines found below the trench bottom illustrate the presence of phosphorous within the structure.

Although the implanted n-type dopant (e.g., phosphorous) can be diffused into the structure at this point by simply heating the structure, according to a preferred embodiment, dopant diffusion is carried out concurrently with the formation of a sacrificial oxide layer. Specifically, a sacrificial oxide layer is grown within the trench at this point, typically by dry oxidation at 900 to 1150° C. for 20 to 60 minutes. As a result, in addition to forming sacrificial oxide regions 205, this elevated temperature step drives the implanted n-type dopant into the N-type region 202 of the epitaxial layer, forming N regions 206. The resulting structure is illustrated in FIG. 4C.

Subsequently, the trench MOSFET is completed to form a structure like that shown in FIG. 2. For example, the sacrificial oxide regions 205 seen in FIG. 4C are removed from the trenches, preferably by wet etch. An oxide layer, which is preferably 500 to 700 Angstroms thick, is then grown over the trench bottom, for example, by dry oxidation at 900 to 1100° C. for 20 to 60 minutes. Portions of this oxide layer ultimately form the gate oxide regions 210 for the finished device.

The surface of the structure is then covered, and the trenches are filled, with a polysilicon layer, preferably using CVD. The polysilicon is typically doped N-type to reduce its resistivity. N-type doping can be carried out, for example, during CVD with phosphorous chloride or by implantation with arsenic or phosphorous. The polysilicon layer is then etched, for example, by reactive ion etching. The polysilicon layer within the trench segments is commonly slightly over-etched due to etching uniformity concerns, and the thus-formed polysilicon gate regions 211 typically have top surfaces that are 0.1 to 0.2 microns below the adjacent surface of the epitaxial layer 204.

A patterned masking layer is then provided and n+ source regions 212, which preferably extend to a depth of 0.3 to 0.5 microns and from the epitaxial layer surface and have net doping concentrations ranging, for example, from $5\times10^{19}$ to $5\times10^{20}$ cm$^{-3}$, are formed in upper portions of the epitaxial layer through the masking layer via an implantation and diffusion process. Implantation is preferably conducted through an implant oxide to avoid implant-channeling effects, implant damage, and heavy metal contamination during formation of the source regions.

A BPSG (borophosphosilicate glass) layer is then formed over the entire structure, for example, by PECVD. After providing the structure with a patterned photoresist layer, the structure is then etched, typically by reactive ion etching, to remove the BPSG and oxide layers over selected portions of the structure, forming BPSG regions 216. The patterned photoresist layer is then removed, and a metal contact layer is deposited, forming source contact 218. Gate and drain contacts (not shown) are also typically provided. The resulting structure is like that of FIG. 2.

Although various embodiments are specifically illustrated and described herein, it will be appreciated that modifications and variations of the present invention are covered by the above teachings and are within the purview of the appended claims without departing from the spirit and intended scope of the invention. As one example, the method of the present invention may be used to form a structure in which the conductivities of the various semiconductor regions are reversed from those described herein.

The invention claimed is:

1. A method of forming a trench MOSFET device comprising:
   providing a substrate of a first conductivity type;
   depositing an epitaxial layer of said first conductivity type over said substrate, said epitaxial layer having a lower majority carrier concentration than said substrate;
   forming a body region of a second conductivity type within an upper portion of said epitaxial layer;
   etching a trench extending into said epitaxial layer from an upper surface of said epitaxial layer, said trench having side portions and a bottom portion and extending to a greater depth from said upper surface of said epitaxial layer than does said body region;
   forming a single doped region of said first conductivity type between said bottom portion of said trench and said substrate, said single doped region having a majority carrier concentration that is lower than that of said substrate and higher than that of said epitaxial layer,
      wherein said single doped region is diffused and spans 100% of the distance from said trench bottom portion to said substrate, and
      wherein the steps of etching said trench and forming said doped region comprise: (a) forming a trench mask directly on said epitaxial layer; (b) etching said trench through said trench mask; (c) implanting a dopant of said first conductivity type through said trench mask; and (d) diffusing said dopant of said first conductivity type at elevated temperature;
   forming an insulating layer lining at least a portion of said trench;
   forming a conductive region within said trench adjacent said insulating layer; and
   forming a source region of said first conductivity type within an upper portion of said body region and adjacent said trench subsequent to said steps of etching said trench and forming said doped region.

2. The method of claim 1, wherein said first conductivity type is n-type conductivity and said second conductivity type is p-type conductivity.

3. The method of claim 2, wherein said dopant is phosphorous.

4. The method of claim 1, wherein said trench MOSFET device is a silicon device.

5. The method of claim 1, further comprising:
   forming a metallic drain contact adjacent said substrate,
   forming a metallic source contact adjacent an upper surface of said source region, and
   forming a metallic gate contact adjacent an upper surface of said conductive region remote from said source region.

6. A method of forming a trench MOSFET device comprising:
   providing a substrate of a first conductivity type;
   depositing an epitaxial layer of said first conductivity type over said substrate, said epitaxial layer having a lower majority carrier concentration than said substrate;
   forming a body region of a second conductivity type within an upper portion of said epitaxial layer;
   etching a trench, having side portions and a bottom portion, extending into said epitaxial layer from an upper surface of said epitaxial layer, said trench extending to a greater depth from said upper surface of said epitaxial layer than does said body region;
   forming a single doped region of said first conductivity type between said bottom portion of said trench and said substrate, said single doped region having a majority carrier concentration that is lower than that of said substrate and higher than that of said epitaxial layer,
      wherein the steps of etching said trench and forming said single doped region comprise: (a) forming a trench mask on said epitaxial layer; (b) etching said trench through said trench mask; (c) implanting a dopant of said first conductivity type through said trench mask; and (d) diffusing said dopant of said first conductivity type at elevated temperature;
   forming an insulating layer lining at least a portion of said trench;
   forming a conductive region within said trench adjacent said insulating layer; and
   forming a source region of said first conductivity type within an upper portion of said body region and adjacent said trench subsequent to said steps of etching said trench and forming said doped region,
      wherein said elevated temperature is provided by a step in which a sacrificial oxide is grown along walls of said trench.

* * * * *

UNITED STATES PATENT AND TRADEMARK OFFICE
CERTIFICATE OF CORRECTION

PATENT NO. : 7,094,640 B2  Page 1 of 1
APPLICATION NO. : 10/725325
DATED : August 22, 2006
INVENTOR(S) : Fwu Iuan Hshieh et al.

It is certified that error appears in the above-identified patent and that said Letters Patent is hereby corrected as shown below:

Col. 4, line 7, after "like", add --that--.

Signed and Sealed this

Tenth Day of April, 2007

JON W. DUDAS
*Director of the United States Patent and Trademark Office*